(12) United States Patent
Janning

(10) Patent No.: US 6,900,093 B2
(45) Date of Patent: May 31, 2005

(54) METHOD OF FABRICATING A ZENER DIODE CHIP FOR USE AS A SHUNT IN CHRISTMAS TREE LIGHTING

(75) Inventor: John L. Janning, Dayton, OH (US)

(73) Assignee: JLJ, Inc., Dayton, OH (US)

( * ) Notice: Subject to any disclaimer, the term of this patent is extended or adjusted under 35 U.S.C. 154(b) by 15 days.

(21) Appl. No.: 10/633,687

(22) Filed: Aug. 5, 2003

(65) Prior Publication Data

US 2004/0229439 A1 Nov. 18, 2004

Related U.S. Application Data

(60) Provisional application No. 60/471,094, filed on May 16, 2003.

(51) Int. Cl.[7] .......................................... H01L 21/8234
(52) U.S. Cl. ..................... 438/237; 438/328; 438/380; 438/983
(58) Field of Search .................. 438/237, 238, 438/328, 380, 381, 393, 394, 460, 462, 514, 530, 533, 983

(56) References Cited

U.S. PATENT DOCUMENTS

| | | |
|---|---|---|
| 1,024,495 A | 4/1912 | Booth |
| 2,072,337 A | 3/1937 | Kamm |
| 2,760,120 A | 8/1956 | Fisherman |
| 3,639,805 A | 2/1972 | Muench et al. |
| 3,912,966 A | 10/1975 | Harnden, Jr. |
| 4,349,394 A * | 9/1982 | Wei .............................. 438/476 |
| 4,450,382 A | 5/1984 | Sawka et al. |
| 4,682,079 A | 7/1987 | Sanders et al. |
| 4,727,449 A | 2/1988 | Fleck |
| 5,006,724 A | 4/1991 | Liu |
| RE34,717 E | 9/1994 | Sanders et al. |
| 5,379,214 A | 1/1995 | Arbuckle et al. |
| 5,539,317 A | 7/1996 | Janning |
| 5,989,963 A * | 11/1999 | Luning et al. .............. 438/289 |
| 6,107,664 A * | 8/2000 | Quoirin et al. ............. 257/355 |
| 6,417,061 B2 * | 7/2002 | Kravtchenko et al. ...... 438/381 |
| 6,580,182 B2 | 6/2003 | Janning |

FOREIGN PATENT DOCUMENTS

| | | |
|---|---|---|
| CH | 427021 | 6/1965 |
| FR | 884370 | 11/1943 |

* cited by examiner

*Primary Examiner*—Amir Zarabian
*Assistant Examiner*—Khanh Duong
(74) *Attorney, Agent, or Firm*—Dickstein Shapiro Morin & Oshinsky LLP

(57) ABSTRACT

A process for fabricating Zener diodes that does not require the use of photomasks. An oxide layer is grown on a silicon substrate which is doped with an N-type dopant. The substrate is subsequently implanted with a P-type dopant, forming a PN junction. The substrate is then metallized for connecting the Zener diode to other circuit components. Advantageously, the substrate may be scribed after processing, before processing, or anytime during processing. Back-to-back Zener diodes formed in this manner are used as shunt circuits across individual lamp sockets in series-wired Christmas light strings to maintain current flow to each of the lamps of the light string when one or multiple lamps fail.

10 Claims, 4 Drawing Sheets

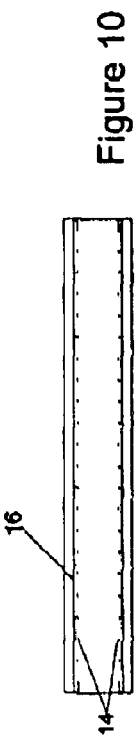
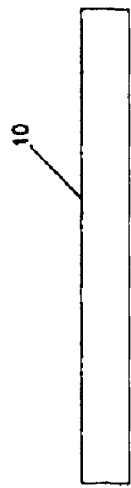
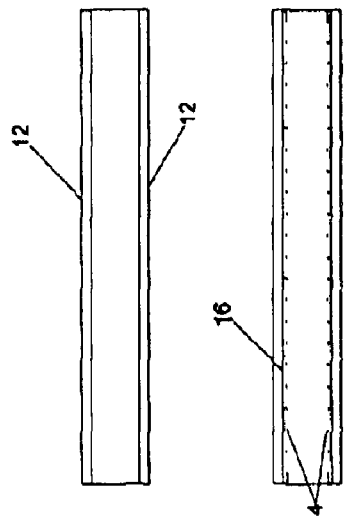
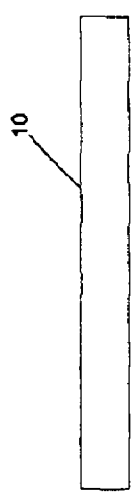
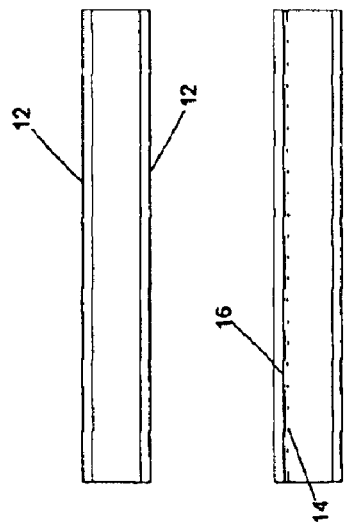
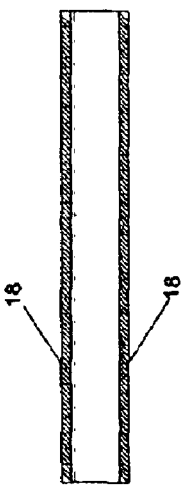

METHOD OF FABRICATING A ZENER DIODE CHIP FOR USE AS A SHUNT IN CHRISTMAS TREE LIGHTING

This application claims the benefit of U.S. Provisional Application Ser. No. 60/471,094, filed on May 16, 2003.

FIELD OF THE INVENTION

The present invention relates to Zener diodes and back-to-back Zener diodes for use as shunts in series-wired Christmas miniature-light sockets and, more particularly, to a method of fabricating such Zener diodes without the use of photomasks.

BACKGROUND OF THE INVENTION

A Zener diode is a solid state device having two contiguous regions of opposite conductivity type (P-type and N-type) and a PN junction at the interface of the two regions. Typically, one of the regions is more lightly doped than the other, and is the region chiefly affecting breakdown voltage of the PN junction.

One of the most common uses of series-wired light strings is for decoration and display purposes, particularly during Christmas and other holidays, and more particularly for the decoration of Christmas trees, and the like. Probably the most popular light set currently available on the market, and in widespread use, comprises one or more strings of fifty miniature light bulbs each, with each bulb typically having an operating voltage rating of 2.5 volts, and whose filaments are connected in a series circuit arrangement. If overall sets of more than fifty bulbs are desired, the common practice is to provide a plurality of fifty miniature bulb strings, with the bulbs in each string connected in series, and with the plurality of strings being connected in a parallel circuit arrangement.

When a string of bulbs is connected in series, if a single bulb fails to illuminate for any reason, the whole string fails to light and it is very frustrating and time consuming to locate and replace a defective bulb or bulbs. Usually many bulbs have to be checked before finding the failed bulb. In fact, in many instances, the frustration and time consuming efforts are so great as to cause one to completely discard and replace the string with a new string before they are even used. The problem is compounded when multiple bulbs simultaneously fail to illuminate for multiple reasons, such as, for example, one or more faulty light bulbs, one or more unstable socket connections, or one or more light bulbs physically fall from their respective sockets, and the like.

There are presently available on the market place various devices and apparatuses for electrically testing an individual light bulb after it has been physically removed from its socket. An apparatus is also available on the market for testing Christmas tree light bulbs by physically placing an alternating current line voltage sensor in close proximity to the particular light bulb desired to be tested. However, such a device is merely an electromagnetic field strength detection device, which may remain in an "on" condition whenever the particular Christmas tree light bulb desired to be tested is physically located in close proximity to another light bulb or bulbs on the Christmas tree.

Light bulb manufacturers have also attempted to solve the problem of detecting a failed bulb by designing each light bulb in the string in a manner whereby the filament in each light bulb is shorted whenever it burns out, thereby preventing an open circuit condition to be present in the socket of the burned-out bulb. However, in actual practice, it has been found that such short circuiting feature within the bulb does not always operate in the manner intended and the entire string will go out whenever a single bulb burns out.

U.S. Pat. No. 5,539,317, entitled CIRCUIT TESTER FOR CHRISTMAS TREE LIGHT SETS, issued Jul. 23, 1996, discloses a hand held and battery operated device which is capable of testing each light bulb in a string without the necessity of removing the bulb from its socket, thereby readily locating the burned out bulb which caused the entire string of bulbs to go out.

Even though each of the foregoing techniques have met with some limited success, none of such devices and techniques have yet been able to further solve the additional problems of the entire string of lights going out as a direct result of either a defective socket, a light bulb being improperly placed in the socket, a broken or bent wire of a light bulb, or whenever a light bulb is either intentionally removed from its socket or is merely dislodged from its socket during handling or movement after being strung on the Christmas tree, particularly in outdoor installations which are subject to wind or other climatic conditions.

U.S. Pat. No. 4,450,382 utilizes a Zener diode connected in parallel with each series connected direct-current lamp used by trucks and other vehicles, particularly military trailers, for burn-out protection of the remaining bulbs whenever one or more bulbs burns out for some reason. It is stated therein that the use of either a single or a plurality of parallel connected Zener diodes will not protect the lamps against normal failure caused by normal current flows, but will protect against failures due to excessive current surges associated with the failure of associated lamps. No suggestion appears therein of any mechanism or technique which would provide a solution to the problem in a simple and economical manner. A plurality of Zener diodes is used to distribute the heat that would be dissipated from a headlight situation where large currents are employed in such a lighting system. The invention does not suggest to use a single high wattage Zener because all of the heat that would be generated would be in one area and cooling would be a problem. Therefore, by using a plurality of lower wattage Zener diodes, the heat could be distributed easier.

Various other attempts have been made to provide various types of shunts in parallel with the filament of each bulb, whereby the string will continue to be illuminated whenever a bulb has burned out, or otherwise provide an open circuit condition, which are commercially feasible.

Examples of such arrangements are found in U.S. Pat. Nos. Re 34,717; 1,024,495; 2,072,337; 2,760,120; 3,639, 805; 3,912,966; 4,450,382; 4,682,079; 4,727,449; 5,379, 214; 5,006,724, 6,580,182, together with Great Britain Patent No. 12,398; Swiss Patent No. 427,021 and French Patent No. 884,370.

Some of these prior art patents provide for continued current flow through the string, but at either a higher or a lower level. The reason for this is that the voltage drop occurring across each prior art shunt is substantially different value than the value of the voltage drop across the incandescent bulb during normal operation thereof.

Several prior art shunts cause an increase in current flow in the series string as a result of a decrease in the voltage dropped across the socket. The higher voltage applied to the remaining bulbs results in higher current flow and a decreased life expectancy of the remaining bulbs in the string. Additionally, the higher voltage also results in increased light output from each of the remaining bulbs in the string, which may not be desirable in some instances.

However, other shunt devices cause the opposite effect, namely an undesired reduced current flow because a high voltage drop occurs across the shunt when a bulb becomes inoperable, either due to an open filament, a faulty bulb, a faulty socket, simply because the bulb is not mounted properly in the socket, or is entirely removed or falls from its respective socket. A reduced current flow results in a corresponding decrease in light output from each of the remaining bulbs in the string. Such an undesirable effect occurs in the prior art attempts, especially the proposed use of a diode in series with a bilateral switch in the Fleck '449 patent, or the proposed use of a metal oxide varistor in the above Harnden '966 patent, or the use of the proposed counter-connected rectifiers in the Swiss '021 patent.

For example, in the arrangement suggested in the above Fleck '449 patent, ten halogen filled bulbs, each having a minimum 12-volt operating rating, are utilized in a series circuit. The existence of a halogen gas in the envelope permits a higher value current flow through the filament allowing for much brighter light to be obtained in a very small bulb size. Normally, when ten 12-volt halogen bulbs are connected in a series string, the whole string goes dark whenever a single bulb fails and does not indicate which bulb has failed. To remedy this undesirable effect, Fleck provided a bypass circuit across each halogen filled bulb that is comprised of a silicon bilateral voltage triggered switch in series with a diode which rectifies the alternating current (i.e., "A.C.") supply voltage and thereby permits current to flow through the bilateral switch only half of the time, i.e., only during each half cycle of the A.C. supply voltage. As stated in Fleck, when a single bulb burns out, the remaining bulbs will have "diminished" light output because the diode will almost halve the effective voltage due to its blocking flow in one direction and conduction flow only in the opposite direction. Such a substantially diminished light output will quite obviously call attention to the failed bulb, as well as avoid the application of a greater voltage which would decrease the life of the remaining filaments. However, in actual practice, a drastic drop in brightness has been observed, i.e. a drop from approximately 314 lux to approximately 15 lux when one bulb goes out. Moreover, as is stated in the patent, the procedure of replacing a burned out bulb involves the interruption of the application of the voltage source in order to allow the switch to open and to resume normal operation after the bulb has been replaced. Additionally, as such an arrangement does not permit more that one bulb to be out at the same time, certain additional desirable special effects such as "twinkling", and the like, would not be possible.

In the arrangement suggested in Harnden '966 patent, Harden proposes to utilize a polycrystalline metal oxide varistor as the shunting device, notwithstanding the fact that it is well known that metal oxide varistors are not designed to handle continuous current flow therethrough. A metal oxide varistor is merely a so-called "one shot" device for protective purposes, i.e. a transient voltage suppressor that is intended to absorb high frequency or rapid voltage spikes and thereby preventing such voltage spikes from doing damage to associated circuitry. Metal oxide varistors are designed for use as spike absorbers and are not designed to function as a voltage regulator or as a steady state current dissipation circuit. While metal oxide varistors may appear in some cases similar to back-to-back Zener diodes, they are not interchangeable and function very differently according to their particular use. In fact, the Harris Handbook states in Application Note 9311: "They are exceptional at dissipating transient voltage spikes but they cannot dissipate continuous low level power." The Harris Handbook further states that its metal oxide varistors cannot be used as voltage regulators as their function is to be used as a nonlinear impedance device. The only similarity that one can draw from metal oxide varistors and back-to-back Zener diodes is that they are both bidirectional.

In the Swiss '021 patent, Dyre discloses a bilateral shunt device having a breakdown voltage rating that, when exceeded, lowers the resistance thereof to 1 ohm or less. This low value of resistance results in a substantial increase in the voltage applied to the remaining bulbs, even when only a single bulb is inoperative for any of the reasons previously stated. Thus, when multiple bulbs are inoperative, an even greater voltage is applied to the remaining bulbs, thereby again substantially increasing their illumination, and consequently, substantially shortening their life expectancy.

In contrast, by utilizing a shunt of the type proposed in the present invention, a substantial number of the bulbs in a 50 bulb string can become inoperative for any or all of the reasons previously stated, with a minimal decrease in intensity of illumination of the remaining bulbs, which is not possible with any of the foregoing shunts. In fact, miniature Christmas tree type lights now rely solely upon a specially designed bulb which is intended to short out upon becoming inoperative. However, such a scheme is not always effective, particularly when a bulb is removed from its socket or becomes damaged in handling, etc. An attempt made by others to keep the bulbs from falling from their sockets is the use of a locking groove formed on the inside circumference of the socket mating with a corresponding raised ridge formed on the base of the bulb base unit. While this particular locking technique apparently is very effective to keep bulbs from falling from their respective sockets, the replacement of defective bulbs by the average user is extremely difficult, if not sometimes impossible, without resorting to mechanical gripping devices which can actually destroy the bulb base unit or socket.

The arrangement of the series-wired light string of the present invention and its function is disclosed and described in U.S. Pat. Nos. 6,580,182 and 6,597,125, which are incorporated herein in their entirety by reference.

SUMMARY OF THE INVENTION

In accordance with the present invention, there is provided a series string of incandescent light bulbs, each having a silicon type shunting device connected thereacross which has a predetermined voltage switching value which is greater than the voltage normally applied to said bulbs, and which shunt becomes fully conductive only when the peak voltage applied thereacross exceeds its said predetermined voltage switching value, which occurs whenever a bulb in the string either becomes inoperable due to any one or combination of the following reasons: an open filament, faulty or damaged bulb, faulty socket, or simply because the bulb is not properly mounted in its respective socket, or is entirely removed or falls from its respective socket, and a circuit arrangement that provides for the continued flow of (nearly) rated current through all of the remaining bulbs in the string, together with a minimal change of illumination in light output from any of those remaining operative in the string even though a substantial number of total bulbs in the string are simultaneously inoperative for any combination of reasons heretofore stated.

The present invention is based upon a series-connected light bulb string which has the desirable features set forth above, and yet is of very simple and economical construction which is relatively inexpensive to manufacture in mass quantities, thereby keeping the overall cost of the final product on the marketplace at a minimum, and which does not necessitate any type of bulb which is specially designed to provide a short circuit whenever it burns out, as is presently the case in substantially all series-wired light strings on the market.

A principal object of the present invention is to provide a novel Zener diode and back-to-back Zener diode which can be used as a shunt in the above-described series light string, and a method of fabricating such Zener diodes. The invention includes the forming of a Zener diode in a semiconductor body portion of one conductivity type having a resistivity of between 0.001 ohm-cm and 1 ohm-cm. A heavily doped opposite conductivity type is formed in the surface of the wafer by diffusion or ion implantation. The surface of the wafer is implanted with an accurately predetermined number of impurity atoms of one conductivity type within the range of about $1 \times 10^{16}$ to $1 \times 10^{19}$ atoms per cubic centimeter of the semiconductor body. A PN junction with a predetermined breakdown voltage thus forms a Zener diode junction. The breakdown voltage of the Zener diode junction is primarily controlled by merely controlling the dose of the implanted impurity in the surface of the wafer.

The present invention also provides a chip fabrication process in which the wafer is scribed before it is processed. By scribing the wafer before processing, various defects in processing, for example, smearing of metallization on the wafer may be reduced or eliminated upon breaking into chips.

BRIEF DESCRIPTION OF THE DRAWINGS

The foregoing and other features and advantages of the invention will become more apparent from the detailed description of the exemplary embodiments of the invention given below in connection with the accompanying drawings.

FIGS. 3 & 8 are cross sectional views of a plain N+ doped silicon wafer;

FIGS. 4 & 9 are cross sectional views of an oxidized silicon wafer;

FIG. 5 is a cross sectional view of an oxidized silicon wafer after ion implantation;

FIGS. 6 & 11 is a sectional view of the silicon wafer of FIGS. 5 & 10 after removal of oxide;

FIG. 7 is a sectional view showing a discrete Zener diode formed in accordance with the invention;

FIG. 10 is a cross sectional view of an oxidized silicon wafer after ion implantation on both sides of the wafer;

FIG. 12 is a cross sectional view showing a discrete back-to-back Zener diode formed in accordance with the invention;

DETAILED DESCRIPTION OF THE INVENTION

The principal objects of the present invention are to provide a novel Zener diode and back-to-back Zener diodes with desired turn-on characteristics to be used as shunts in a series-wired light string.

It is well known to those skilled in the art of fabricating Zener diodes that the turn-on characteristic of a Zener diode is a function of current through the Zener diode. However, what is not known or recognized by those of skill in the art is that the turn-on characteristic of a Zener diode is also a function of the chip size at a particular current with the same processing parameters, which is most likely the result of a size standardization for given power dissipations. For example, a chip designed to dissipate one-half watt may be designed into silicon at a particular chip size. The IV (current to voltage) characteristics would show what the Zener voltage would be at various current levels for a given doping concentration and substrate selection. Therefore, a particular Zener, manufactured according to its specifications might have a Zener voltage of (for example) five volts at one milliampere. At ten milliamperes, the Zener voltage would increase to above five volts. At higher currents, the Zener voltage could increase beyond six volts. Now, this same Zener processing, if applied to a larger area chip size, would result in a lower Zener voltage at the same currents as before. If the silicon chip size were large enough, the current that before resulted in a Zener voltage beyond six volts, could now result in a Zener voltage of five volts.

Figure 1:
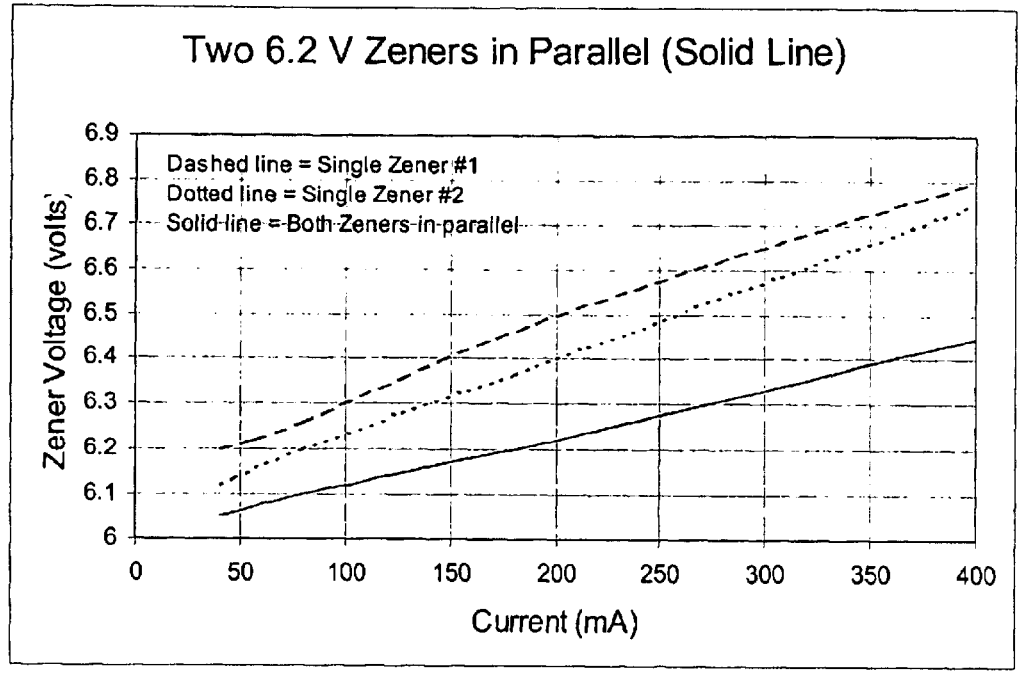
FIG. 1 illustrates an IV plot of two 6.2 volt Zener diodes connected in parallel as well as a plot of each individually.

To illustrate this, FIG. 1 shows an IV plot of two 6.2 volt Zener diodes connected in parallel as well as a plot of each individually. Note that when both Zener diodes are connected in parallel, the IV characteristics change to a lower Zener voltage for a given amount of current. Therefore, the same change would occur if the chip area were doubled.

Figure 2:
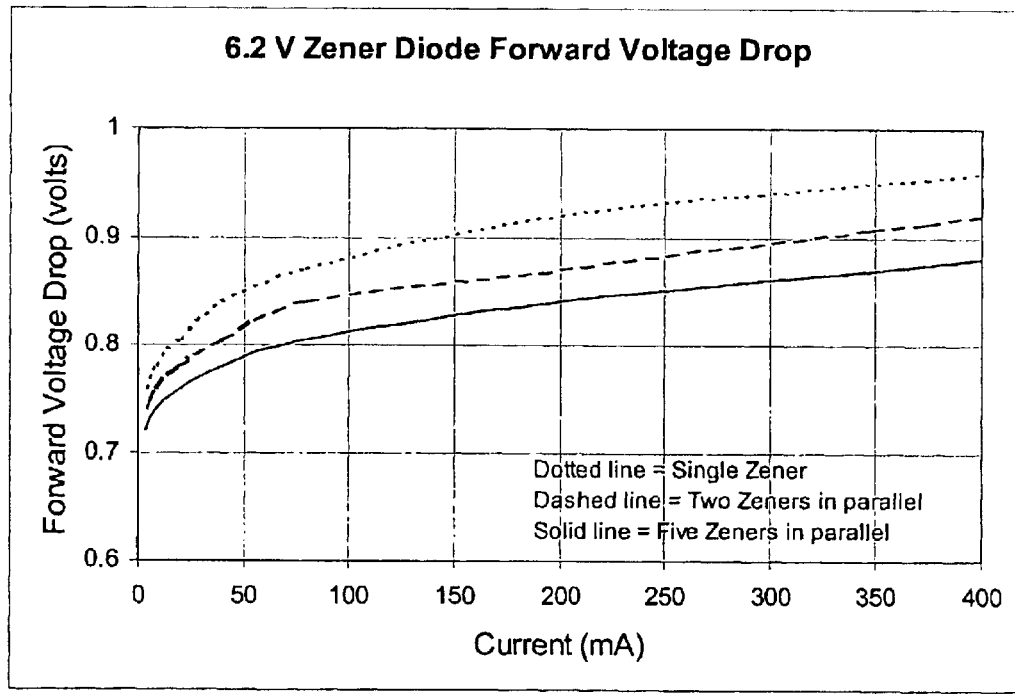
FIG. 2 shows the forward voltage drop of the same 6.2 volt Zener diodes comparing one, two and five such devices connected in parallel.

FIG. 2 shows the same sort of change concerning the forward voltage drop of the same 6.2 volt Zener diodes comparing one, two and five such devices connected in parallel. Note that as more Zener diodes are connected in parallel, the forward voltage drop goes down. Therefore, the same change would occur if the chip area were doubled or increased five-fold. In securing the data for FIG. 2, a Zener with exactly the same (matching) IV characteristics as the single Zener shown-was used in the "two Zeners in parallel" curve.

Figure 2A:
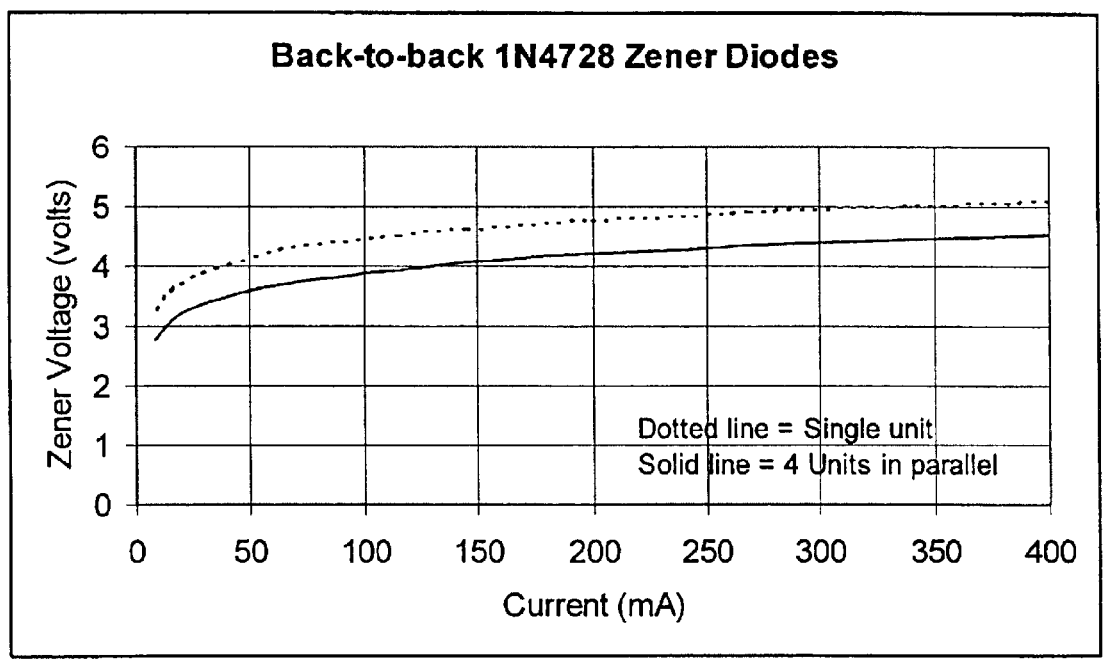
FIG. 2A shows the forward voltage drop of a single back-to-back Zener diode unit as compared to four such units connected in parallel.

FIG. 2A likewise shows the forward voltage drop of back-to-back Zener diodes, comparing a single unit to four units in parallel. As shown, the Zener voltage of a single unit at 50 milliamperes is the same as at 200 milliamperes for the four units in parallel. Thus, the actual Zener voltage is lowered when units are placed in parallel or when their chip area is increased proportionally.

The "turn-on" characteristics of a Zener diode include a "knee" where current begins to increase rapidly. The 'roundness' of this knee is wholly dependent on the current through the Zener diode of a given physical size area-wise or multiple Zener diodes connected in parallel, when all processing parameters are the same.

Therefore, to achieve a more desirable 'knee' in the IV curve for Christmas light shunts, a chip size of greater than 500 millionths (½ of one thousandth) of a square inch is desirable in chips for use as shunts in a series-wired string of miniature lights as used in Christmas decorating. For some applications, a chip size several times that area would be desirable. One of these applications would be for a random twinkle effect in a light string. An area of three to five thousandths of a square inch would be desirable in a random twinkle application because such a shunt would draw excessive current when connected in parallel with an operating bulb. The more current that is drawn by a shunt of a given size in parallel with an operating bulb, the better the voltage regulation in that particular light socket. When shunts incorporating back-to-back Zener diodes of small silicon area size are used, the knee of the IV curve is more distinct, but the voltage regulation is not as desirable for random twinkling light sets as a more 'rounded knee' in the IV curve. Such shunt devices cause 'flickering' in series-wired light strings of the remaining bulbs when only ten or fifteen percent of the bulbs are of the flashing or twinkling type.

While it may appear that the sharper the turn-on, the better the voltage regulation, and the better for random twinkling, that is not the case. In actual practice with reasonable device tolerances, it is not desirable to use sharp turn-on devices in series-wired light strings with flasher bulbs installed for random twinkling because a sharp turn-on device creates undesired flickering when too many twinkle lights are added, which affects the remaining non-flashing lights. Consequently, rounded knee devices are preferred in such a string of lights, even though more current may be consumed.

Most of the series-wired mini-lights today operate with 140 to 200 milliampere bulbs at between 2.5 and 3.5 volts. Standard off-the-shelf Zener diodes have too small of a silicon chip area to give the required rounded knee IV characteristic that these bulbs need for desired random twinkling.

The use of larger area chips comes at a performance price. While the lighting effects are much better, the current dissipation is increased and more power is used to achieve these benefits. Leakage currents of ten to twenty milliamperes may be expected for significantly larger chips.

Reference is now made to FIG. 7 which shows a cross-section of a discrete Zener diode and FIG. 12 which shows a back-to-back Zener diode made in accordance with this invention. The Zener diodes have a homogeneously doped mono-crystalline N-type silicon body 10 with a <111> or <100> crystal orientation. The body 10 is a silicon wafer having a given resistivity within the range of approximately 0.001 to 1 ohm-centimeter. This corresponds to an N-type doping in the body 10 of about $1 \times 10^{16}$ to $1 \times 10^{19}$ N-type conductivity determining impurity atoms per cubic centimeter of silicon. In this example, body 10 has a desired resistivity of about 0.01–0.02 ohm-cm.

The first step is to grow a layer of silicon oxide 12 onto the silicon wafer as shown in FIGS. 4 & 9. This is done by standard means in a furnace with oxygen flowing, or sometimes steam, to a thickness of 100 to 1000 Angstroms. Next, boron is implanted through this oxide into the silicon wafer by ion implantation. This is depicted in FIG. 5 and FIG. 10 by the dotted lines.

A blanket P+ region 14 is formed within surface 16 of body 10. The conductivity impurity in region 14 is boron. This P+ region is formed preferably by ion implantation on the order of approximately $1 \times 10^{17}$ boron ions per square centimeter at an energy of 30 to 70 keV.

After the ion implantation, which may be done on one side or both sides of the wafer, the wafer is subjected to a thermal anneal to anneal out any crystalline damage that occurred during the ion implantation. This can be accomplished by a furnace anneal or rapid thermal annealing, both of which are known to those skilled in the art.

After the anneal has taken place, the wafer is etched and cleaned to remove all traces of silicon oxide. This step is necessary before metallization can take place. The cleaned wafer (FIGS. 6 & 11) is then placed in a vacuum system and metallized according to standard metallization procedures in the semiconductor industry. Aluminum, preferably, with a small silicon content (and sometimes a trace of copper) is deposited 18 onto both sides of the wafer (FIGS. 7 & 12) to a desired thickness of approximately 1 micron. Metallization can also be done by electroless deposit known to those skilled in the art. This is a low cost means of metallizing and metallic films can be deposited maskless or selective. Depositing selectively only on P+ regions would help in reducing potential shorts.

After the metallization step, the wafer is placed in a furnace for alloying the aluminum to the silicon wafer, which is a standard procedure used throughout the semiconductor industry.

In the manufacturing or fabrication of these shunt devices, photomask steps are not involved. There are no "scribe channels" as found in standard semiconductor 'chip' manufacturing where wafers are 'scribed' for breakage into individual 'chips'.

Figure 13:
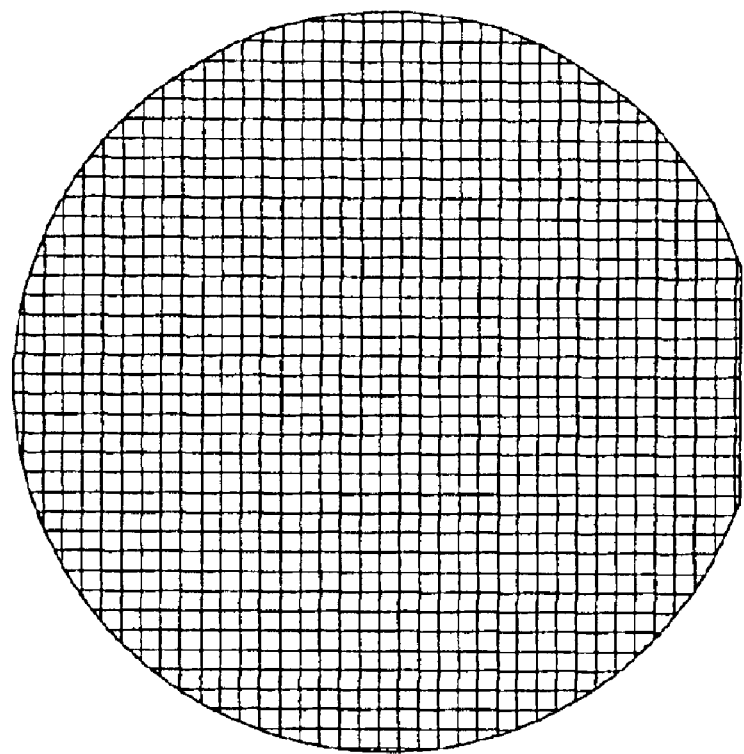
FIG. 13 shows the semiconductor wafer after scribing, but before being diced into 'chips'.

Next, the wafer is scribed to the length and width of the desired end product and cut into many 'chips' as shown in FIG. 13. Advantageously, scribing of the wafer may also occur before the wafer is processed, either before or after the initial step of growing silicon dioxide on the surface of the wafer, or in fact at any time during the processing of the wafer. The wafer can then be separated into chips after processing. By scribing the wafer prior to or during processing, smearing of metallization (which could cause shorts if the wafer is scribed and broken into chips after processing) is eliminated or greatly reduced.

Scribing before or during wafer processing has a number of benefits: 1) shorts caused by metal smearing during post processing scribing are reduced or eliminated; and 2) the metallization thickness in the scribed area is less than the metallization on the chip because the metal deposit thickness is a function of the angle of metal being deposited. In thermal evaporation, thickness is a function of the angle of deposit. Thickness varies as the cosine of the angle of the incoming deposit. In sputtering, thickness is dependent upon sputtering pressure of the vacuum but also surface area to receive deposit versus area of the wafer. If the area of the wafer is fixed and the surface area is increased, for example from scribing, the thickness will vary accordingly.

Figure 14:
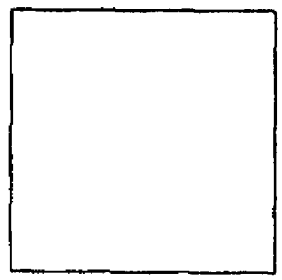
FIG. 14 shows a single 'chip' after dicing from the wafer.

A single 'chip' is shown in FIG. 14. This 'chip' can now be packaged in the well known DO-41 package or any desired package. It can also be mounted inside the Christmas light socket and secured by various means including being contained in place using epoxy.

While preferred embodiments of the invention have been described and illustrated above, it should be understood that these are exemplary of the invention and are not to be considered as limiting. For example, this invention is not limited to any particular type of silicon wafer, or to any particular type of implanted impurity, nor to any particular implant dose or energy. It is also not limited to doping by implant only, but impurities can be diffused by thermal means known to those skilled in the art. Moreover, additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A method of fabricating a Zener diode, comprising a fabrication process of:
   growing a silicon oxide layer onto a silicon wafer doped with a first dopant;
   implanting a second dopant into said silicon wafer through the silicon oxide layer without discrete masking;
   annealing said silicon wafer;
   removing said silicon oxide layer from said silicon wafer; and
   metallizing said silicon wafer;
   wherein said silicon wafer is scribed during said fabrication process.

2. The method of claim 1, wherein said silicon wafer is homogeneously doped with a mono-crystalline N-type dopant.

3. The method of claim 2, wherein said N-type silicon wafer has a <111> crystal orientation.

4. The method of claim 2, wherein said N-type silicon wafer has a <100> crystal orientation.

5. The method of claim 2, wherein said silicon wafer is doped with $1 \times 10^{16}$ to $1 \times 10^{19}$ atoms of N-type dopant per cubic centimeter of said silicon wafer.

6. The method of claim 5, wherein said doping produces a silicon wafer having a resistivity of 0.001 to 1 ohm per centimeter.

7. The method of claim 1, wherein said second dopant comprises boron.

8. The method of claim 7, wherein said boron is implanted at the order of $1 \times 10^{17}$ ions per cubic centimeter of said silicon wafer at an energy level of 30 to 70 keV.

9. The method of claim 1, further comprising the step of scribing said silicon wafer prior to growing said oxide layer.

10. The method of claim 1, further comprising the step of scribing said silicon wafer after said step of growing said oxide layer but prior to said step of metallizing said silicon wafer.

* * * * *